Figure 1:
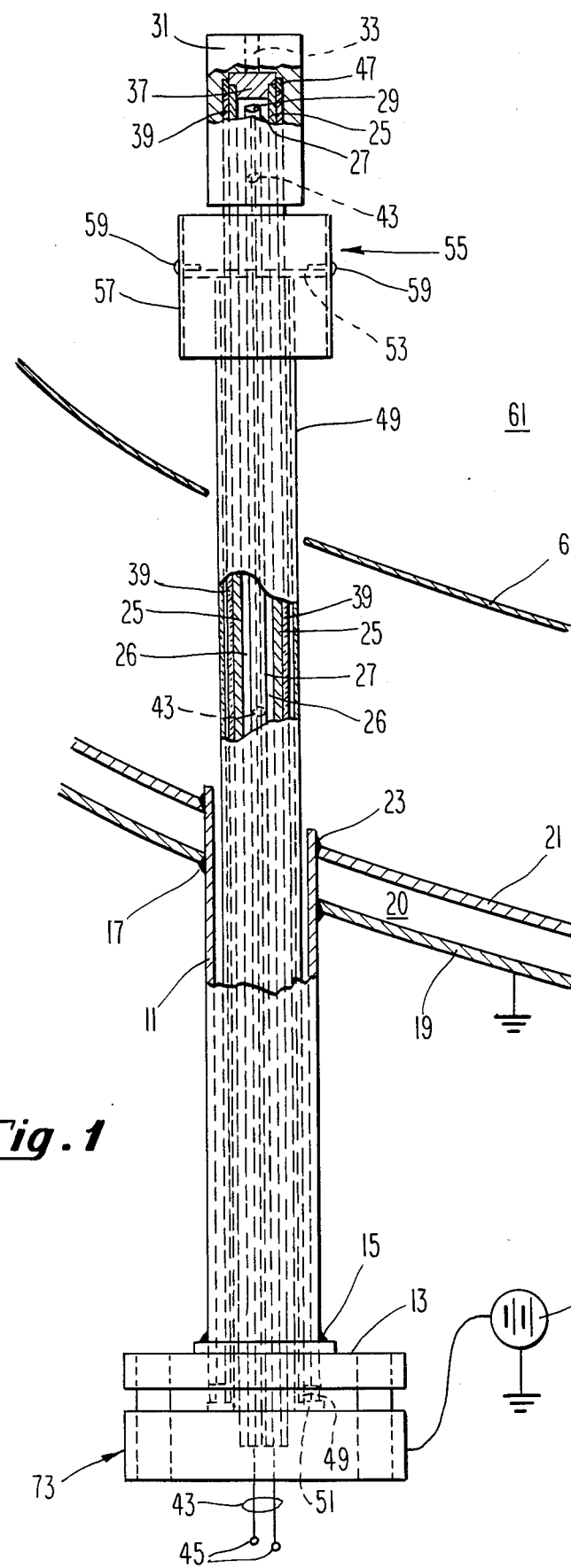

United States Patent [19]
Jones

[11] Patent Number: 4,760,584
[45] Date of Patent: Jul. 26, 1988

[54] HEARTH SUPPORT ARRANGEMENT

[76] Inventor: William R. Jones, 3 Hillcroft Way, Telford, Pa. 18964

[21] Appl. No.: 60,776

[22] Filed: Jun. 12, 1987

[51] Int. Cl.$^4$ .............................................. F27D 3/02
[52] U.S. Cl. .................................................... 373/112
[58] Field of Search ............... 373/109, 110, 111, 112, 373/137; 219/390

[56] References Cited
U.S. PATENT DOCUMENTS

| 4,102,637 | 7/1978 | Kreider et al. | 373/112 |
| 4,246,434 | 1/1981 | Gunther et al. | 373/112 |

Primary Examiner—Roy N. Envall, Jr.
Attorney, Agent, or Firm—William E. Cleaver

[57] ABSTRACT

The present arrangement includes a plurality of hearth support members. In the preferred embodiment each hearth support member is located to pass through the wall of a vacuum furnace housing and on into the hot zone thereof. Each hearth support member includes a hollow stainless steel tube which is secured at its bottom end to a brass base member. At the top end of each hollow support member there is located an electrically conducting adapter which is formed to supportively engage with the hearth. Within each hollow support member a ceramic encapsulated thermocouple is located with the ceramic encapsulating member running the length of the metallic hollow support member and the lead wires to the thermocouple protruding therefrom. Each hollow support member assembly is: (1) connected to an electrical energy source to provide electrical energy to the hearth; (2) electrically isolated from the vacuum furnace housing; (3) insulated by ceramic sleeves to prevent a glow discharge between the support member and the wall; and (4) secured (but insulated) at a section along its length from the outside of the vacuum furnace housing. Accordingly the support members physically support the hearth, provide electrical energy thereto which is necessary to effect a plasma within the vacuum furnace and provide a means for measuring temperature at the hearth.

13 Claims, 2 Drawing Sheets

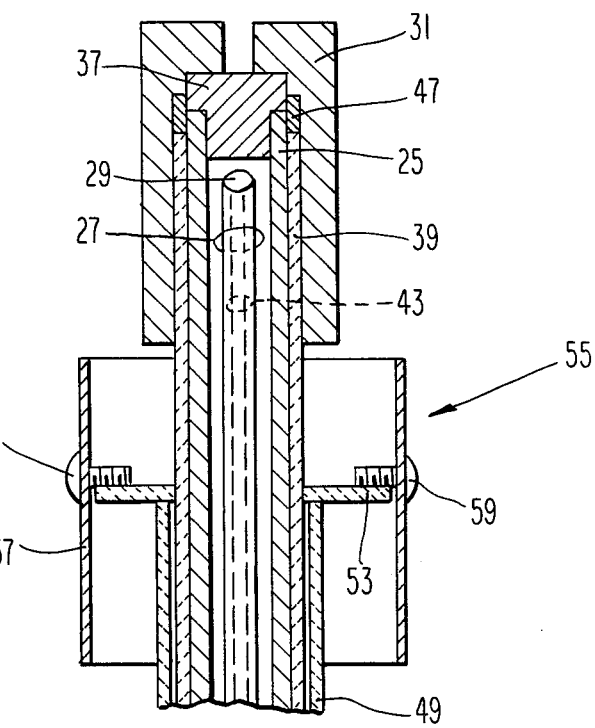
Fig. 2
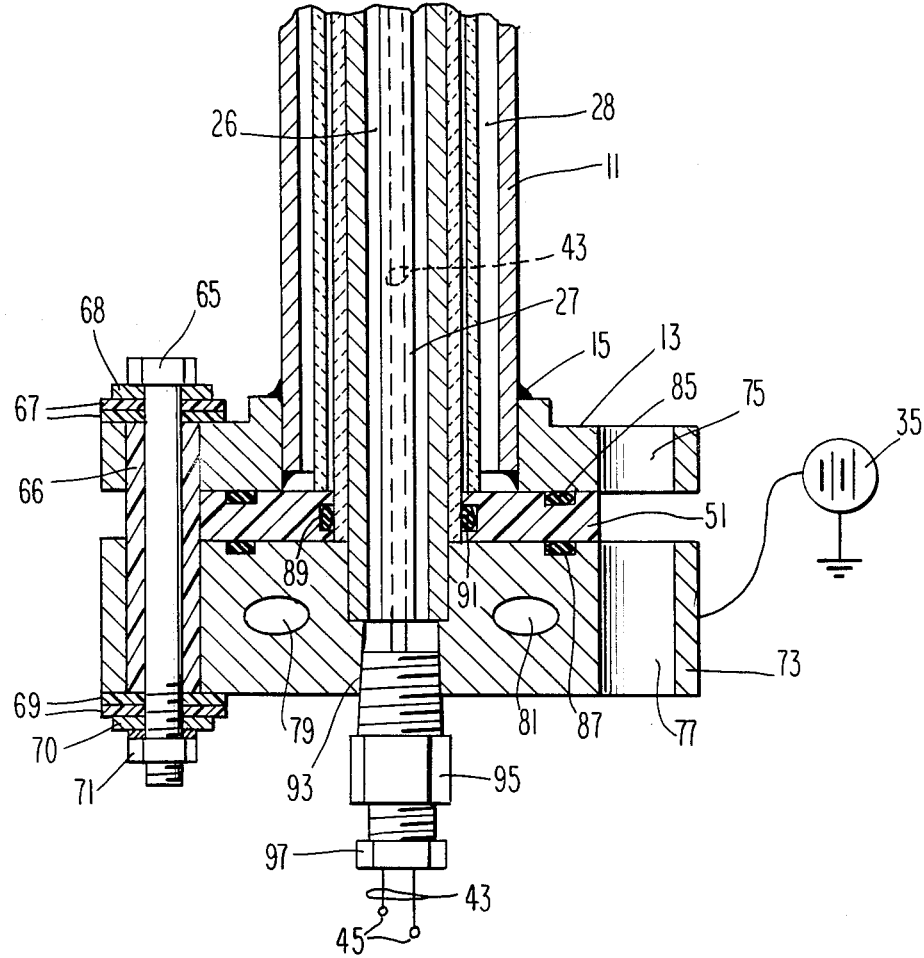

HEARTH SUPPORT ARRANGEMENT

BACKGROUND OF THE DISCLOSURE

In order to effect ion nitriding (or other forms of ion reaction) a plasma must be generated within a vacuum chamber. As is well understood a plasma phenomenon can be effected by providing a difference of potential across an ionizable gas such as nitrogen. In the prior art the difference of potential has been created between the hearth and the wall of the furnace chamber by connecting the wall of the chamber to ground and connecting the hearth to a negative potential. In such arrangements the hearth is independently connected by a power feed through device to a power source. The present system eliminates the need for independent power feed through devices. As is well understood, an ion nitride surface is partially effected by a reaction between ions of nitrogen along with ions of hydrogen and the workpiece. Ion nitriding is often desirable to provide a hard surface for a piece of equipment. For instance an ion nitrided surface is developed on gears which need to be surface hardened. Such a reaction is greatly influenced by the amount of heat present in the workpiece. In the prior art there has been difficulty in trying to directly monitor the temperature (and therefore the heat present) of the workpiece. Directly monitoring the temperature of the workpiece provides a basis for repeated successes in ion nitriding efforts. The present arrangement, because of the location of the thermocouple in each of the hollow supports, permits the temperature of the hearth and therefore the temperature of the workpieces to be continually and directly monitored which is an improvement over the prior art.

SUMMARY OF THE DISCLOSURE

The present arrangement includes a plurality of support members which act to hold up, or support, a hearth upon which workpieces are being held. In the preferred embodiment each support member is hollow and is fabricated from electrically conducting material such as stainless steel. Within each hollow support there is located an elongated ceramic member. Encapsulated within that ceramic member are a thermocouple junction and lead wires connected from said thermocouple junction. The lead wires extend from the ceramic member and are disposed to be connected to a meter or some form of temperature monitoring device. A ceramic sleeve is fitted over each of the hollow supports to insulate the hollow support from the wall of the furnace. In addition the ceramic sleeves prevent the hollow supports per se from becoming targets for ion activity. The top of each hollow support is fitted with an adapter which is fabricated from electrical conducting material (in the preferred embodiment the material is graphite). Graphite is not sputterable. Each adapter is formed to engage, or interlock, with the hearth so that the hollow supports not only support the hearth but also provide a good electrical connection between the hollow supports and the hearth. At the bottom end of each hollow support, that is the end which extends outside of the furnace wall, there is located an associated brass base member. Each brass base member is threaded onto its associated hollow support. Each brass member has apertures therein which carry water conduits, which in turn act to dissipate heat developed in the structure. A plurality of coupling members, in the form of hollow pipes each with an end flange thereon, pass through apertures in the vacuum furnace housing and are secured thereto by welds. Each hollow support is arranged to pass through a different coupling member and therefore through the furnace wall to the hearth. In addition each brass base member, into which a hollow support is threaded, is secured to the flange of an associated coupling member. There are numerous insulation pieces which serve to electrically insulate the hollow supports from the pipes (coupling members) and from the wall. In accordance with the aboved described structure, electrical energy is applied to the brass base member and is transmitted therefrom along the hollow supports to the hearth. In addition the wall of the furnace is attached to a more positive electrical potential (in the preferred embodiment the wall is connected to ground) than the hearth. Hence a difference of potential can be created across an ionizable gas in the vacuum furnace to generate a plasma which will result in ions being moved to workpieces on the hearth. At the same time the user can constantly monitor heat which is present at the workpieces. The monitoring of hearth heat enables the user to have repeated successful ion nitriding endeavors. The heat at various positions on the hearth can be determined by switching the temperature monitoring device to the various thermocouple circuits. In this way the average hearth temperature can be determined, internal temperature gradients can be determined, "cold spots" can be determined, etc.

The objects and features of the present invention will be better understood in view of the following description taken in conjunction with the drawings wherein:

FIG. 1 is a pictorial view of the hearth support arrangement as mounted on the furnace wall and passing through the hot zone into the position wherein it locks onto the hearth; and FIG. 2 is a sectional and enlarged view of the hearth support.

In FIG. 1 there is shown the coupling member 11 in a cutaway form. The coupling member 11, in the preferred embodiment, is a pipe which is hollow therethrough as can be seen in FIG. 1. The pipe 11 has a flange 13 welded thereon by weld 15. In addition the coupling member 11 is welded by virtue of weld 17 to the outer wall 19 of the furnace housing and is further welded to the innerwall 21 by the weld 23. Note that there is an aperture to accommodate the coupling member 11. The aperture passes through the outer wall 19 of the vacuum furnace and through the inner wall 21 of the vacuum furnace. The space 20 between the inner wall 21 and outer wall 19 provides a means for holding a water cooling conduit. It is apparent from FIG. 1 that the coupling means 11 is securely positioned onto the housing of the vacuum furnace and it is ready to accept the hearth support assembly.

As can be seen in FIG. 1, the hearth support assembly includes a stainless steel support 25. The stainless steel support 25 is hollow therethrough and contains an elongated ceramic encapsulating tube 27. On the end of the encapsulating tube 27 there is located a thermocouple junction 29. Thermocouple junction 29 and the ceramic encapsulating tube 27 provide the basis for directly and independently monitoring the temperature at the hearth.

Note that the thermocouple junction 29 in the ceramic encapsulating tube 27 is located inside of the adaptor device 31. The adaptor device 31 holds the hearth (not shown) with a tongue and groove type interlocking arrangement. The hearth has a protrusion which locks into the groove 33. The adaptor 31 is made of electrically conducting material (which in the preferred embodiment is graphite) and hence electron flow (during a glow discharge) is from the power source 35, through the base member 73, along the stainless steel support 25, through the plug cap 37 to provide electrical energy to the adapter 31 and to the hearth. Of course, since the hearth is held at negative potential with respect to the wall of the furnace there is conventional current, during a glow discharge, passing from the wall to the hearth and through the stainless steel support 25, through the base member 73 to the power source 35. Before discussing the thermocouple junction 29 it should be noted that surrounding the stainless steel rod 25 is ceramic jacket 39. In the preferred embodiment the ceramic jacket 39 is made of Pyrex but other forms of ceramic could be used.

Considering the role of the ceramic jacket 39, we find that the workpieces, which are seated on the hearth, are raised to high temperatures in response to the heat from the hot zone and further in addition to the electrical current (during a plasma phenomenon) which passes through the workpieces elements and through the hearth. It is well understood that forming of an ion nitrided surface involves a reaction in which heat plays a very important role. It follows that, if there have been successful yields of ion nitrided work pieces, the user of the vacuum furnace (which is being employed to effect the ion nitriding), will want to keep the hearth and therefore the workpieces at some previously determined (successful) temperature. Very often that temperature is determined by empirical techniques but once it is established the user wants to keep the workpieces at that temperature in order to have successful runs with high yields. By having a thermocouple junction 29 located within the hearth adapter 31, the thermocouple junction 29 provides a reading of the temperature at that section of the hearth. Since there are many adapters holding the hearth, the temperature of the hearth as a whole can be determined or as mentioned earlier temperature profiles of the hearth temperatures can be determined or mapped. It should be noted that the thermocouple junction 29 is connected to a pair of wires 43, which are shown in phantom because they are passing through the ceramic encapsulating tube 27. The wires 43 are shown emanating from the hearth support assembly at the bottom of FIG. 1. It will be noted that connected to the wires 43 are terminals 45 (usually a plug) which are available to be connected to an electronic pyrometer. It should be borne in mind that in the preferred embodiment there are three to twelve hearth supports employed and as mentioned above the temperature over the entire hearth can be monitored by an electrical switching technique.

The plug 37, which is made of electrically conducting material, such as stainless steel, not only serves as the end of a power conduit device but also serves to prevent plasma from entering within the hollow support 25 creating a glow discharge within that structure. The ceramic jacket 39 serves to protect the stainless steel support 25 from having materials (which are being sputtered) build up on that stainless steel support thus creating shorted electrical paths.

As will be better understood from FIG. 2, there is a metallic (electrically conductive) short sleeve 47 which partially surrounds the flange section of plug 37 and overlaps a small portion of the metallic support 25. The metallic short sleeve 47 sits on top of the ceramic sleeve 39 and fits snugly around the periphery of the stainless steel support 25. The metallic short sleeve 47 acts to ensure that there is no ion leakage between the stainless steel support 25 and the ceramic sleeve 39.

As can be gleaned from FIGS. 1 and 2, there is a second ceramic sleeve 49 which surrounds the ceramic sleeve 39 up to the point where the second sleeve 49 comes in contact with the Pyrex washer 53. In a preferred embodiment the second sleeve 49 is fabricated from mullite but it should be understood that it could be fabricated from other forms of heat resistant materials. The second ceramic sleeve 49 extends from the Teflon washer 51 to the Pyrex washer 53. The Pyrex washer 53 is located in a sputter trap 55 located below the adapter 31 and on top of the second sleeve 49. The sputter trap 55 is made of a metal tube 57 which is supported on the Pyrex washer 53 by a plurality of screws 59. Other forms of support mechanisms, of course, could be used. When ion nitriding (or some other ion reaction) is in being, sputtered atoms of material are free in the chamber 61. The atoms, which would normally build up on the ceramic sleeve and form a short circuit between the wall of the furnace and the hearth, come to rest on the outer wall of the sputter trap 55. The sputter trap 55 is electrically neutral and the atoms which come to rest are prevented from reaching the ceramic sleeves and thus provide no short circuits.

In FIG. 1 there is shown a heat shield 63 which serves to keep the heat generated within the hot zone which surrounds the chamber 61.

Consider FIG. 2 which depicts a sectionalized view of the end pieces of the structure of FIG. 1 but in greater detail. The upper end of the structure shown in FIG. 2 includes the hearth adaptor 31, the plug 37, the inner ceramic sleeve 39, a metal hollow support 25, the short sleeve 47, the thermocouple junction 29, the ceramic tube 27, the lead wires 43 to the thermocouple junction, the sputter trap 55, the Pyrex washer 53, the outer ceramic sleeve 49, and the screws 59. All of the foregoing elements and the roles that they play in the upper structure of FIG. 1 have been discussed above and it would appear that there is no need to repeat such a discussion.

In the lower section of FIG. 2, however, note that the bolt 65 passes through a tubing member 66, a metal washer 68, two electrically non-conducting washers 67, two additional non-electrically conducting washers 69, a second flat metal washer 70, and is threaded by the nut 71. It is apparent that the bolt 65 has a thread on the end which fits into the nut 71. It should be noted that, in the preferred embodiment, the two pairs of non-electrically conducting washers (67 and 69) are fabricated from Synthane but other suitable materials could be used. The purpose, of course, is to keep the bolt 65 electrically insulated from the flange 13 and from the base member 73. The bolt 65 when "threaded up" secures the flange 13 to the base member 73. While it is not shown in FIG. 2 it should be understood that a second bolt, a second group of six washers, a second tubing member and a second nut are all located in, or in proximity to, the cylindrical holes 75 and 77. It should also be understood that there are four positions (two additional positions not shown) for such bolt arrangements to secure the flange 13 to the base member 73 by four bolts.

As can be further gleaned from FIG. 2, there are two holes 79 and 81 which pass through each of the base members for the entire assembly. Into each of these holes 79 and 81 there is located a tube through which water is pumped as a heat conductor to conduct the heat away from the entire structure and in particular from the flange and the base member. It should be borne in mind that while in respect to FIGS. 1 and 2 we are describing a single hearth support device that there is a plurality of such hearth support devices holding up the hearth. In one embodiment there are twelve such hearth support devices all of which resemble the one described in connection with FIGS. 1 and 2. The water tubing just described passes through each of those hearth support devices to reduce the heat transmitted along the metal and material devices that make up the support member. If the heat were not conducted away by the water, overheating would occur and damage would be done to the spacer 51 and to the O ring seals 87, 85, and 91.

As can be further gleaned from FIG. 2 separating the flange 13 and the base member 73 is a relatively thick Teflon spacer 51. While in the preferred embodiment the spacer 51 is made of Teflon, other suitable non-electrical conducting materials could be used. Into the Teflon spacer 51 there is cut an annular groove into which there is fitted a Buena O ring 85. Further it should be noted that into the base member 73 there is cut an annular groove into which there is inserted a Buena O ring 87. The purpose of the O rings 85 and 87 is to effect a seal so that when the hollow support 25 is pumped down it will remain in vacuum. Further it should be noted that around the aperture of the Teflon spacer 51 there is formed a groove 89 into which there is inserted a Buena O ring 91. The purpose of the O ring 91 is to also effect a seal so that gas ions will not travel from the space 26 to the space 28. It should be noted in FIG. 2 that the base member 73 is threaded in the aperture 93 so that the threaded feed through 95 can be threaded thereinto to provide a basis for enabling the ceramic tube 27 and space 26 to be pumped down and then sealed. By sealing the top of the hollow support 25 with the plug 37 and the bottom, the space 26 is prevented from having a glow discharge take place therein. The sealing mechanism on the bottom is a grommet which is located within the assembly 95. The grommet is held in place by the threaded plug 97. As can be seen in FIG. 2 that the threaded feed through 95 has a threaded plug 97 threaded thereinto and as can be further seen from plug 97 the two wires 43 (from the thermocouple junction 29) emerge. It will be recalled that in the description of FIG. 1 that the metal housing 11 was secured by welds to the outside wall of the vacuum tube so that the hearth support members described with respect to FIGS. 1 and 2 do not actually come to rest on the floor upon which the vacuum furnace is located.

The present device enables the electrical power to be supplied to the hearth without the necessity of drilling additional holes in the side of the vacuum furnace for feed through devices and complicating the procedure with sealing techniques to seal where the feed through devices are located. In addition, the present arrangement provides for locating thermocouple junctions in the immediate area of the hearth so that the heat which is applied to the workpieces can be continually monitored and duplicated. The present hearth support is a combination of a mechanical support means, an electrical feed through means and a direct temperature monitoring means.

I claim:

1. Means to support a hearth means within the hot zone of a vacuum furnace, comprising in combination: at least one hollow support member having first and second ends and fabricated from electrical conducting material; base means having an aperture therethrough and being fabricated of electrical conducting material, said base means being secured to said first end of said hollow support member and having means for being secured to electrical power; coupling means secured to said base means and adapted to be secured to the wall of said vacuum furnace, said coupling means including means to electrically isolate said coupling means from said base means; temperature responsive means for sensing ambient temperatures including lead wires through which electrical energy signals can be detected to determine the temperature which is sensed by said temperature responsive means; ceramic encapsulating means formed to encapsulate said temperature responsive means and a substantial portion of said lead wires, said ceramic encapsulating means disposed within said hollow support member to place said temperature responsive means at said second end of said hollow support member and to place said lead wires through said aperture in said base means; and capping means secured over said second end of said hollow support member to prevent any plasma phenomenon generated within said vacuum furnace from extending into said hollow support member, said capping means designed to supportively engage said hearth means whereby when electrical energy is applied to said base member said electrical energy is further applied to said hearth means through said hollow support member and whereby when said means to support a hearth is used with a vacuum furnace the temperature at said hearth is determinable from said temperature responsive means.

2. Means to support a hearth according to claim 1 wherein said coupling member is formed to be secured to the housing of a vacuum furnace.

3. Means to support a hearth according to claim 1 and wherein there is included a plurality of said hollow support members each with a first and second end, a plurality of said base members, a plurality of said coupling members, a plurality of said capping means each of which is disposed over the second end of a different one of said hollow support members, a plurality of said temperature responsive means, and a plurality of said ceramic encapsulating means with each ceramic encapsulating means encapsulating a different one of said temperature responsive means and each ceramic encapsulating means disposed in a different one of said hollow support members, and with each base member secured to a different one of said hollow support members and with each coupling member secured to a different one of said base members and with each coupling member formed to be secured to a housing of a vacuum furnace with which said plurality of hollow support members are used.

4. Means to support a hearth according to claim 1 wherein said capping means is formed to seal said hollow support member and thus enable said hollow support member to be pumped down to a vacuum status and prevent a glow discharge from forming within said hollow support member.

5. Means to support a hearth means according to claim 1 and wherein there is further included electrical insulation means disposed between said coupling means and said hollow support member.

6. Means to support a hearth means according to claim 1 and wherein said capping means is fabricated from electrically conducting material.

7. Means to support a hearth means according to claim 1 wherein said capping means is fabricated from graphite.

8. Means to support a hearth means according to claim 1 wherein there is further included a first ceramic sleeve which extends around, and substantially along the length, of said hollow support member.

9. Means to support a hearth means according to claim 8 wherein there is a second ceramic sleeve disposed to fit over and extend along a substantial portion of said first ceramic sleeve member.

10. Means to support a hearth means according to claim 9 where there is further included a sputter trap means which is disposed to be supported by said second ceramic sleeve member.

11. A means to support a hearth means according to claim 1 wherein said coupling means includes a flange portion and wherein said flange portion is separated from said base means by an electrically nonconducting means.

12. Means to support a heart means according to claim 11 wherein said flange means is secured to said base means by a plurality of bolts and wherein each of said bolts is electrically insulated from both said flange means and said base means.

13. Means to support a hearth means according to claim 9 wherein there is a first space between said second ceramic sleeve member and said coupling means and wherein there is a second space between said ceramic encapsulating means and said hollow support member and wherein there is included sealing means disposed in abutment with said coupling means and said hollow support means to prevent ions from passing between said first and second spaces.

* * * * *